United States Patent [19]

Gross et al.

[11] Patent Number: 4,922,192
[45] Date of Patent: May 1, 1990

[54] ELASTIC MEMBRANE PROBE

[75] Inventors: Hal D. Gross, San Diego, Calif.;
Gerard M. Hudon, St. Paul, Minn.

[73] Assignee: Unisys Corporation, Blue Bell, Pa.

[21] Appl. No.: 240,798

[22] Filed: Sep. 6, 1988

[51] Int. Cl.$^5$ .......................... G01R 1/02; G01R 1/04
[52] U.S. Cl. ............................ 324/158 P; 324/72.5;
324/158 F
[58] Field of Search ............... 324/72.5, 158 P, 158 F,
324/73 PC, 73 R

[56] References Cited

U.S. PATENT DOCUMENTS

| | | | |
|---|---|---|---|
| 3,405,361 | 10/1968 | Kattner et al. | 324/158 P |
| 3,596,228 | 7/1971 | Reed, Jr. | 324/158 F |
| 4,636,722 | 1/1987 | Ardezzone | 324/158 P |
| 4,721,831 | 1/1988 | Vora | 174/137 A |
| 4,758,785 | 7/1988 | Rath | 324/158 P |
| 4,820,976 | 4/1989 | Brown | 324/158 F |

Primary Examiner—Reinhard J. Eisenzopf
Assistant Examiner—W. Burns
Attorney, Agent, or Firm—Charles J. Fassbender; Robert S. Bramson

[57] ABSTRACT

An electro-mechanical probe is comprised of a thin flat ring-shaped frame, and an elastic transparent membrane which is attached to a downward-facing surface of the ring-shaped frame and which traverses the aperture of the ring. On this membrane are a plurality of microscopic conductive bumps which are aligned with and which are outside of the aperture of the ring. Also integrated into the membrane are a plurality of microscopic conductors, and they serve as a means for sending electrical signals to and receiving electrical signals from the bumps. In operation, the probe frame is fitted with a cover which overlies the elastic membrane to thereby form an enclosed chamber. Both the cover and the elastic membrane are transparent so that the bumps on the membrane can be aligned with corresponding contacts on a semiconductor chip or interconnect module which is to be tested. A port is provided in the cover so that a gas can be input to the chamber to expand the elastic membrane and thereby force the bumps against the contacts of the circuit being tested.

12 Claims, 4 Drawing Sheets

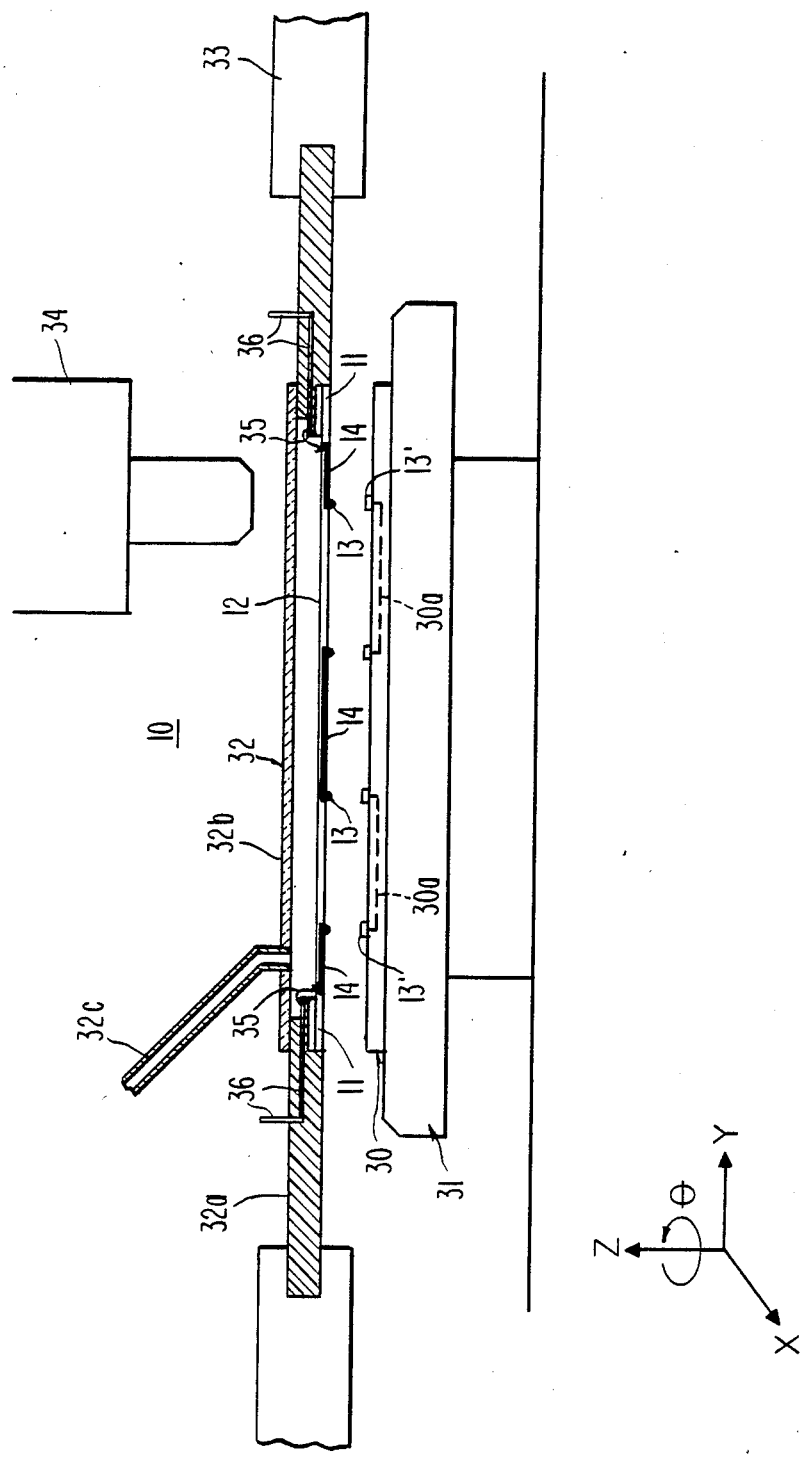

ELASTIC MEMBRANE PROBE

BACKGROUND OF THE INVENTION

This invention relates to electro-mechanical probes which are used in testing microscopic circuits such as those which are in semiconductor chips and multichip interconnect modules.

During the fabrication of semiconductor chips, it is necessary to probe and test the chips individually before they are soldered or otherwise permanently placed in a multichip interconnect module. Similarly, it is necessary that the bare multichip interconnect module (such as that described in U.S Pat. No. 4,721,831) be probed and tested before it receives any integrated circuit chips. Such separate testing avoids expensive reworks and/or scrapping of the unit which the permanently joined chips and module form.

In the prior art, the probing of various contacts on the chips and the interconnect modules was performed by what is commonly called "a bed of nails". This bed of nails is comprised of a plurality of thin wires which are held in a cantilevered fashion such that their ends form a pattern which corresponds to the contacts that are to be probed. Thus the ends of the wires constitute probe tips. Electrical connections between these probe tips and the contacts on the chips or interconnect module are made by mechanically urging them together until the wires deflect slightly.

A problem, however, with these bed of nails probes is that the maximum density of the probe tips is too limited. State of the art probes can only be arranged in patterns of about 10 mils (254 micrometers) on center. By comparison, the transistors and their interconnect lines within an integrated circuit chip and interconnect module can have feature sizes of one micrometer or less.

Also, another problem with the bed of nails probes is that their wires are very fragile and are easily bent. Thus, as a practical matter, the total number of probes in a bed of nails is limited to less than 1,000. By comparison, the total number of contacts on a multichip interconnect module can be several thousand.

Still another problem with the bed of nails probe is that the force between a probe tip and its contact is determined by many factors which are difficult to control. For example, a probe wire may be slightly bent, or the contacts on an interconnect module may be at slightly different heights. And, an excessive probe tip force can damage the corresponding contact, whereas small probe tip force can yield an open circuit.

Accordingly, a primary object of the invention is to provide an improved electro-mechanical probe for testing microscopic circuits in which the above problems are overcome.

BRIEF SUMMARY OF THE INVENTION

An electro-mechanical probe, in accordance with the invention, is comprised of a thin flat ring-shaped frame, and an elastic transparent membrane which is attached to a downward-facing surface of the ring-shaped frame and which traverses the aperture of the ring. On this membrane are a plurality of microscopic conductive bumps which are aligned with and which are outside of the aperture of the ring. Also integrated into the membrane are a plurality of microscopic conductors, and they serve as a means for sending electrical signals to and receiving electrical signals from the bumps.

In operation, the probe frame is fitted with a cover which overlies the elastic membrane to thereby form an enclosed chamber. Both the cover and the elastic membrane are transparent so that the bumps on the membrane can be aligned with corresponding contacts on a semiconductor chip or interconnect module which is to be tested. Also, a port is provided in the cover so that a gas can be input to the chamber to expand the elastic membrane and thereby force the bumps against the contacts of the circuit being tested.

BRIEF DESCRIPTION OF THE DRAWINGS

Various features and advantages of the invention are described herein in conjunction with the accompanying drawings wherein:

FIG. 3 illustrates an electro-mechanical assembly in which the probe of FIG. 1 is utilized to test a microscopic circuit.

DETAILED DESCRIPTION OF THE INVENTION

Figure 1:
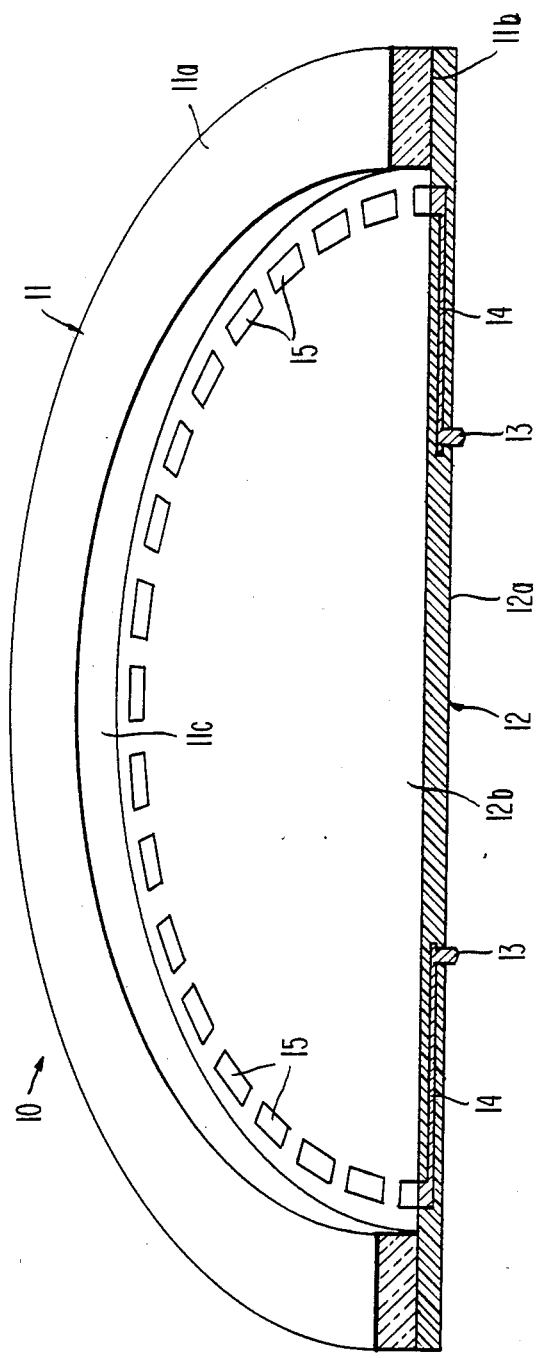
FIG. 1 is a pictorial view of a preferred embodiment of a probe that is constructed according to the invention in which one-half of the probe is cut away so that its internal makeup, can be seen.

Referring now to FIG. 1, a preferred embodiment of an electro-mechanical probe 10 which is constructed according to the invention will be described. In FIG. 1, only half of the probe 10 is shown so that its internal makeup can be seen; and, the unillustrated half of probe 10 is the same as the illustrated half.

Probe 10 is comprised of a thin flat ring-shaped frame 11. This frame 11 has an upward-facing surface 11a and a downward-facing surface 11b, each of which is one-half inch to three inches wide. An aperture 11c, which is one to ten inches across, extends through both of the surfaces 11a and 11b to thereby give frame 11 its ring shape. Preferably, frame 11 is made of a semiconductor wafer such as silicon or germanium or gallium arsenide.

Attached to the downward-facing surface 11b and traversing aperture 11c is an elastic transparent membrane 12. Preferably, membrane 12 is comprised of multiple layers of polyimide. A surface 12a of membrane 12 lies outside of the aperture 11c, and a plurality of conductive bumps 13 are integrated on it. These bumps operate as probe tips; and they are arranged on surface 12a in a pattern which is the mirror image of a set of contacts on a microscopic circuit (not shown) which are to be probed. Each bump is from one-half to twenty micrometers across, from two to forty micrometers high, and their total number on surface 12a ranges from 200 to 40,000.

Also disposed on the layers of membrane 12 are respective sets of conductors 14. These conductors 14 connect to the bumps 13, to thereby enable electrical signals to be sent to and received from them. Wire bonding pads 15 are provided at the ends of the conductors 14 on surface 12b of membrane 12 around the perimeter of aperture 11c.

Figure 2A:
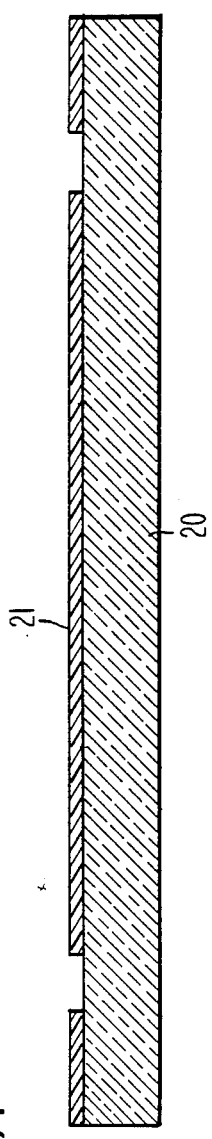
FIGS. 2A–2E illustrate the steps by which the probe of FIG. 1 is constructed.

A preferred process by which probe 10 is fabricated is illustrated in FIGS. 2A thru 2E. To begin, a semiconductor wafer 20 is coated with a 2-4 micrometer thick layer of polyimide 21 on one of its surfaces. Then, openings are formed in the polyimide layer 21 where the wire bonding pads 15 are to be located. This is shown in FIG. 2A.

Figure 2B:
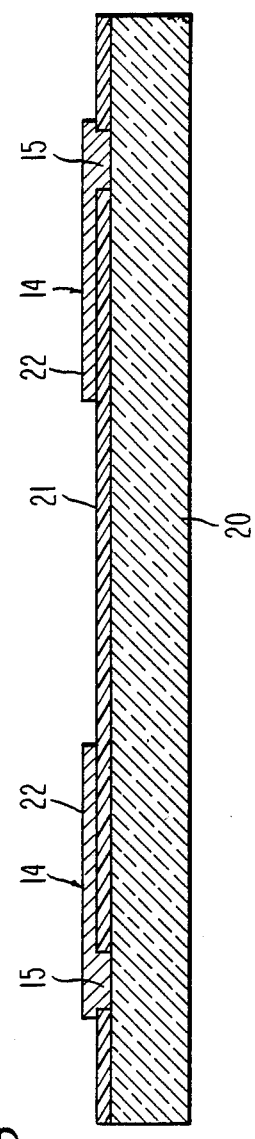

Thereafter, the patterned polyimide layer is covered with a layer of metal 22. Suitably, the metal layer 22 is comprised of aluminum or copper, and it is deposited by sputtering to a thickness of 2-4 micrometers. Then, the metal layer 22 is patterned by the same photolithography techniques that are used in making integrated circuit chips; and the result of this step is shown in FIG. 2B. This patterning forms the bonding pads 15 and some of the conductors 14 in FIG. 1. Each of the conductors is from one to twenty micrometers wide, and hundreds of them are patterned from a single metal layer 22.

Figure 2C:
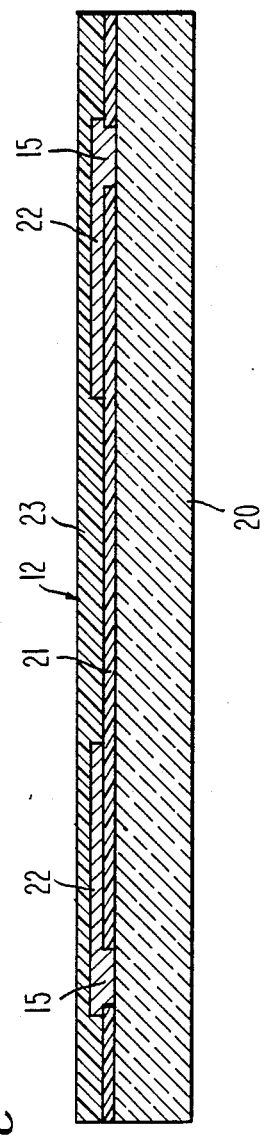

Subsequently, as FIG. 2C shows, another layer of polyimide 23 is deposited over the patterned metal layer 22. Then, if additional patterned conductors are needed, they are formed by opening via holes in the top polyimide layer and repeating the steps of FIGS. 2B and 2C one or more times. This results in a multilayer polyimide membrane with patterned conductors disposed between the various layers; and it corresponds to membrane 12 of FIG. 1. This polyimide membrane 12 can be as thin as five micrometers when it covers a small aperture 11c of one inch diameter, and it can be as thick as five hundred micrometers when it covers a large aperture 11c of ten inch diameter.

Figure 2D:
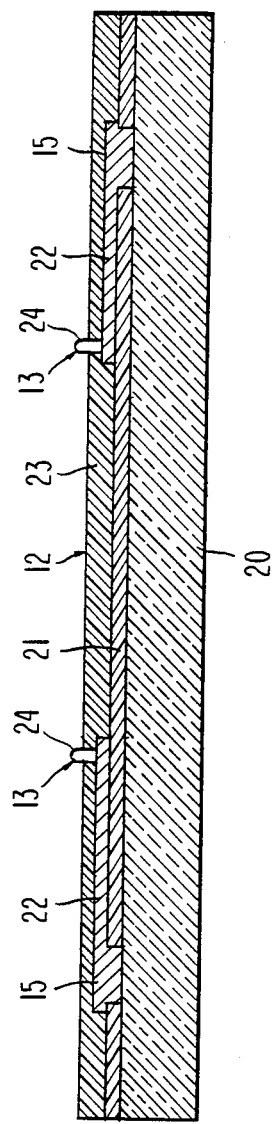

Later, as is shown in FIG. 2D, conductive bumps 24 are formed on the patterned conductors 22. These bumps 24 serve as probe tips, and they correspond to the bumps 13 in FIG. 1. These bumps 24 are made by covering the top surface of membrane 12 with a layer of photoresist, patterning the resist such that it exposes the location of the bumps, etching via holes in the polyimide membrane 23 at the exposed locations to the conductors 22, and plating the bumps 24 in the polyimide holes with a hard metal such as gold.

Figure 2E:
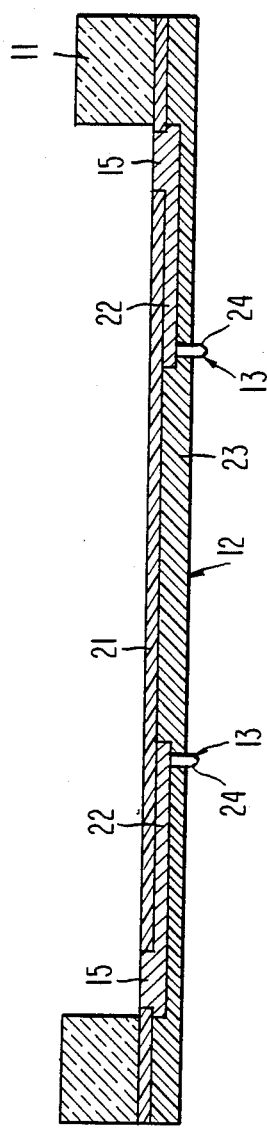

Thereafter, as is shown in FIG. 2E, the central portion of the semiconductor wafer 20 is removed to thereby form the frame 11 of FIG. 1. This is achieved by patterning a ring of photoresist on the top surface of the FIG. 2E structure, and subjecting the exposed portion of wafer 20 which lies within the ring to an etchant that will selectively attack the semiconductor wafer but not polyimide or the bonding pad metal. One suitable etchant is a mixture of three parts 48% hydrofluoric acid to one part 90% nitric acid which will remove the exposed silicon at a rate of about twenty mils per minute.

Turning now to FIG. 3, it shows how the probe 10 is utilized in a system to test a microscopic circuit in an interconnect module 30. In FIG. 3, reference numeral 31 indicates a vacuum chuck which holds module 30 and positions the module in the X, Y, Z, and $\theta$ directions; reference numeral 32 indicates a cover for the probe 10; reference numeral 33 indicates a platen which holds the covered probe 10 and positions it in the Z direction; and reference numeral 34 indicates a microscope.

Preferably, as FIG. 3 shows, the cover 32 is comprised of a printed circuit board 32a which surrounds and is attached to the probe frame 11, and a flat transparent glass or plastic lid 32b which is attached to the printed circuit board 32a and overlies the probe membrane 12. Suitably, the printed circuit board 32a and the probe frame 11 are attached and sealed to each other via an adhesive; whereas the printed circuit board 32a and the flat transparent lid 32b are attached with screws. Bonding wires 35 electrically interconnect the bonding pads on the membrane 12 to electrical conductors 36 in the cover 32.

In operation, the chuck 31 and platen 33 are used to position the probe bumps 13 and module 30 such that the probe bumps 13 are aligned with a corresponding set of contacts 13' on module 30. Microscope 34 is utilized in this step by viewing the bumps 13 and the contacts on module 30 through lid 32b and membrane 12, both of which are transparent. This alignment step positions the bumps 13 within 0.1 to 1.0 mils directly above the corresponding contact points on module 30.

Following the above alignment step, a gas is forced through a port 32c in the cover 32 to the chamber which is formed by probe 10 and its cover. Suitably, this gas is compressed dry air or dry nitrogen; and it functions to expand the elastic membrane 12 and thereby force the bumps 13 against their corresponding contacts 13' on module 30. This enables the module 30 circuitry 30a between the contacts 13' to be tested.

A selected contact force is obtained by adjusting the pressure of the gas. Suppose, for example, that a contact force of 0.8 grams per bump 13 is desired, and suppose further that membrane 12 contains a total of 10,000 bumps. Then, the total force which membrane 12 must exert on the bumps is 8,000 grams or 17.6 pounds. That force divided by the area of membrane 12 gives the gas pressure. For example, if the diameter of the membrane 12 is three inches, then the gas pressure should be adjusted to $17.6/\pi(3)^2$ or 0.62 psi.

One primary advantage of the above-described probe assembly is the high density with which it can probe electrical contacts in a microscopic circuit. This high density is achieved because each of the bumps 13 and their electrical interconnections 14a on membrane 12, as formed by the photolithographic process of FIGS. 2A and 2E, are only a few microns across. At the same time, the bumps 13 and their interconnections 14b are much more rugged than a bed of nails since they are held in place by the membrane 12. Further, the disclosed probe can readily accommodate height variations and other irregularities in the surface of module 30 which is being probed since the elastic membrane 12 will conform under the gas pressure to those variations.

Preferred embodiments of the invention have now been described in detail. In addition, however, many changes and modifications can be made to these details without departing from the nature and spirit of the invention. For example, the printed circuit board 32a in FIG. 3 may be replaced with a multilayer ceramic substrate having the conductors 36 on the ceramic layers. Accordingly, it is to be understood that the invention is not limited to the above details but is defined by the appended claims.

What is claimed is:

1. An electro-mechanical probe assembly, for testing conductive paths in an interconnect module; said probe assembly comprising: a frame having an upward facing surface, a downward-facing surface, and an aperture therethrough; an elastic membrane attached to said downward-facing surface and traversing said aperture; a rigid cover attached to said upward-facing surface and traversing said aperture; said rigid cover and said membrane being transparent over said aperture and there forming an enclosed chamber; a port to said chamber for inputting a gas thereto to expand said membrane, and vice versa; and a plurality of conductive bumps on said membrane outside of said chamber; wherein said probe assembly further includes:

a first set of conductors on said membrane which are smaller in number than the number of bumps in said plurality, each conductor of said first set connecting a respective one of said bumps to conductors on said cover;

a second set of conductors on said membrane, each of which connects a respective pair of said bumps to each other; and, said second set of conductors and respective pairs of bumps being disposed on said membrane such that they, together with said conductive paths in said module, form serial interconnections between the conductors of said first set and their corresponding bumps.

2. An electro-mechanical probe assembly according to claim 1 wherein said frame is a semiconductor wafer with a hole through its center, and said membrane is integrated directly onto said wafer with no adhesive therebetween.

3. An electro-mechanical probe assembly according to claim 2 wherein said aperture in said frame is at least one inch across.

4. An electro-mechanical probe assembly according to claim 2 wherein each of said conductive bumps on said membrane is one-half to twenty micrometers across and their total number on said membrane is at least two hundred.

5. An electro-mechanical probe assembly according to claim 2 wherein said membrane is comprised of multiple layers of polyimide with said conductors disposed thereon.

6. An electro-mechanical probe assembly according to claim 2 wherein said membrane is from 5 $\mu$m to 500 $\mu$m thick.

7. An electro-mechanical probe assembly according to claim 2 wherein said cover is comprised of a multilayer printed circuit board which is attached to said frame, and a transparent lid which is attached to said printed circuit board and overlies said aperture.

8. An electro-mechanical probe assembly according to claim 2 wherein said cover is comprised of a ceramic member which is attached to said frame, and a transparent lid which is attached to said ceramic membrane overlies said aperture.

9. An electro-mechanical probe for testing conductive paths in an interconnect module; said probe comprising: a frame having an upward-facing surface, a downward-facing surface, and an aperture therethrough; an elastic transparent membrane attached to said downward-facing surface and traversing said aperture; and a plurality of conductive bumps on said membrane outside of said aperture; wherein said probe further includes:

a first set of conductors on said membrane which are smaller in number than the number of bumps in said plurality, each conductor of said first set connecting a respective one of said bumps to a corresponding bonding pad on the perimeter of said membrane;

a second set of conductors on said membrane, each of which connects a respective pair of said bumps to each other; and, said second set of conductors and respective pairs of bumps being disposed on said membrane such that they, together with said conductive paths in said module, form serial interconnections between the conductors of said first set and their corresponding bumps.

10. An electro-mechanical probe according to claim 9 wherein said frame is comprised of a semiconductor wafer with a hole through its center, and said membrane is comprised of polyimide which is integrated directly onto said wafer with no adhesive therebetween.

11. An electro-mechanical probe according to claim 9 wherein said frame is comprised of a material which can be selectively etched without etching said membrane and which is integrated directly onto said wafer with no adhesive therebetween.

12. An electro-mechanical probe according to claim 11 wherein said aperture is at least one inch across and the total number of bumps on said membrane is at least two hundred.

* * * * *